(12) United States Patent
Ohashi et al.

(10) Patent No.: US 9,254,651 B2
(45) Date of Patent: Feb. 9, 2016

(54) LIQUID EJECTING HEAD, LIQUID EJECTING APPARATUS, PIEZOELECTRIC ELEMENT, AND METHODS OF MANUFACTURING LIQUID EJECTING HEAD, LIQUID EJECTING APPARATUS, AND PIEZOELECTRIC ELEMENT

(71) Applicant: Seiko Epson Corporation, Tokyo (JP)

(72) Inventors: Koji Ohashi, Matsumoto (JP); Yasuhiro Itayama, Chino (JP); Kenichi Kurokawa, Suwa (JP); Eiji Osawa, Chino (JP); Motohisa Noguchi, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/849,909

(22) Filed: Mar. 25, 2013

(65) Prior Publication Data

US 2013/0258000 A1 Oct. 3, 2013

(30) Foreign Application Priority Data

Mar. 27, 2012 (JP) ................................. 2012-072572
Mar. 27, 2012 (JP) ................................. 2012-072574

(51) Int. Cl.
| | |
|---|---|
| *B41J 2/045* | (2006.01) |
| *B41J 2/14* | (2006.01) |
| *B41J 2/16* | (2006.01) |
| *H01L 41/08* | (2006.01) |
| *H01L 41/09* | (2006.01) |
| *H01L 41/319* | (2013.01) |
| *H01L 41/18* | (2006.01) |
| *H01L 41/22* | (2013.01) |
| *H01L 41/27* | (2013.01) |

(52) U.S. Cl.
CPC .......... *B41J 2/14201* (2013.01); *B41J 2/14233* (2013.01); *B41J 2/161* (2013.01); *B41J 2/1629* (2013.01); *B41J 2/1631* (2013.01); *H01L 41/0815* (2013.01); *H01L 41/0973* (2013.01); *H01L 41/18* (2013.01); *H01L 41/22* (2013.01); *H01L 41/27* (2013.01); *H01L 41/319* (2013.01)

(58) Field of Classification Search
None
See application file for complete search history.

(56) References Cited

U.S. PATENT DOCUMENTS

| | | | | |
|---|---|---|---|---|
| 2004/0046481 | A1* | 3/2004 | Takeuchi et al. | 310/311 |
| 2005/0190239 | A1* | 9/2005 | Ito et al. | 347/68 |
| 2007/0226974 | A1* | 10/2007 | Li | 29/25.35 |
| 2008/0118722 | A1* | 5/2008 | Shikata et al. | 428/212 |
| 2009/0072673 | A1* | 3/2009 | Fujii et al. | 310/358 |
| 2010/0292522 | A1* | 11/2010 | Chun et al. | 585/648 |

FOREIGN PATENT DOCUMENTS

| | | |
|---|---|---|
| EP | 2363901 A2 | 9/2011 |
| JP | 06-166519 | 6/1994 |
| JP | 09-129827 | 5/1997 |

(Continued)

OTHER PUBLICATIONS

Extended European Search Report for Application No. EP 13 16 1189 dated Dec. 12, 2014 (7 pages).

*Primary Examiner* — Matthew Luu
*Assistant Examiner* — Erica Lin
(74) *Attorney, Agent, or Firm* — Harness, Dickey & Pierce, P.L.C.

(57) ABSTRACT

Provided is a liquid ejecting head including a piezoelectric element which includes a piezoelectric layer and electrodes provided on the piezoelectric layer on an upper portion of a zirconium oxide layer, in which the zirconium oxide layer is formed of granular crystal grains.

5 Claims, 8 Drawing Sheets

(56) References Cited

FOREIGN PATENT DOCUMENTS

| JP | 2003-145762 | 5/2003 |
| JP | 2005-294438 | 10/2005 |
| JP | 2006-143535 | 6/2006 |
| WO | WO-2011-082031 A1 | 7/2011 |

* cited by examiner

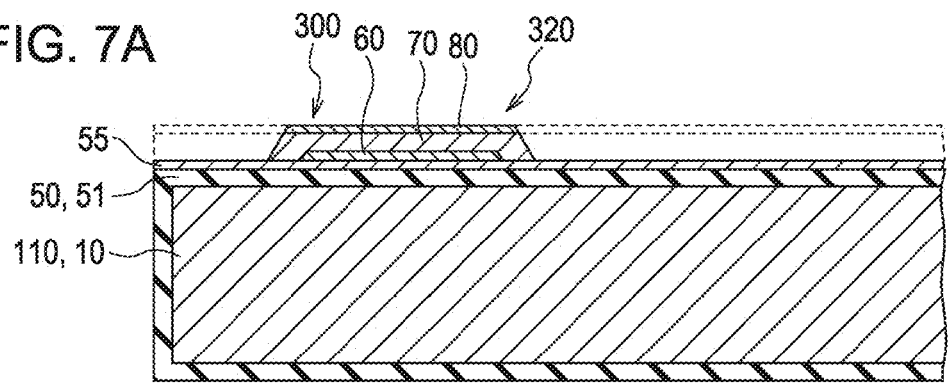
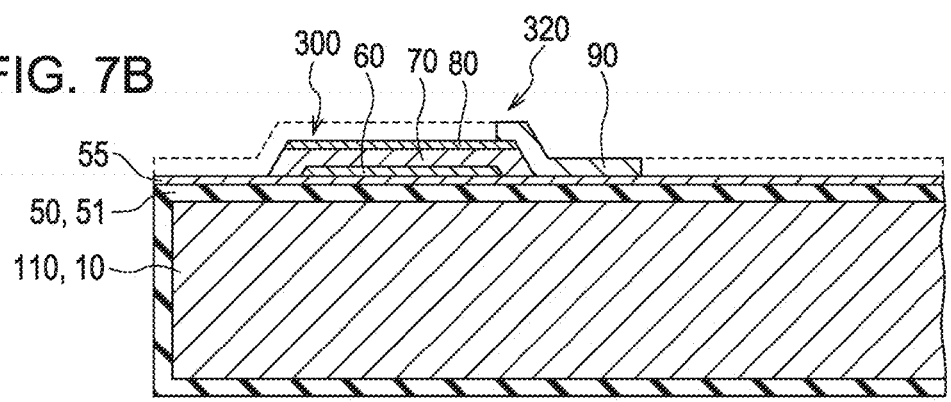
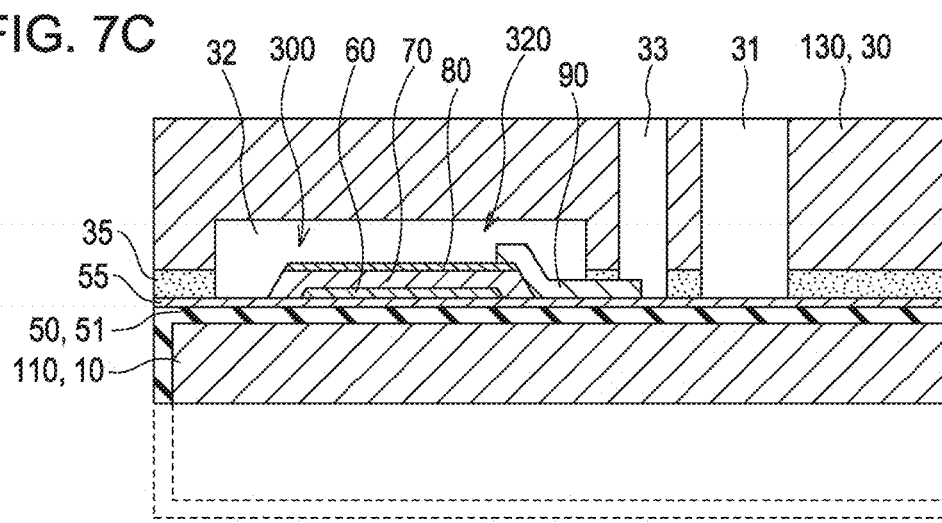

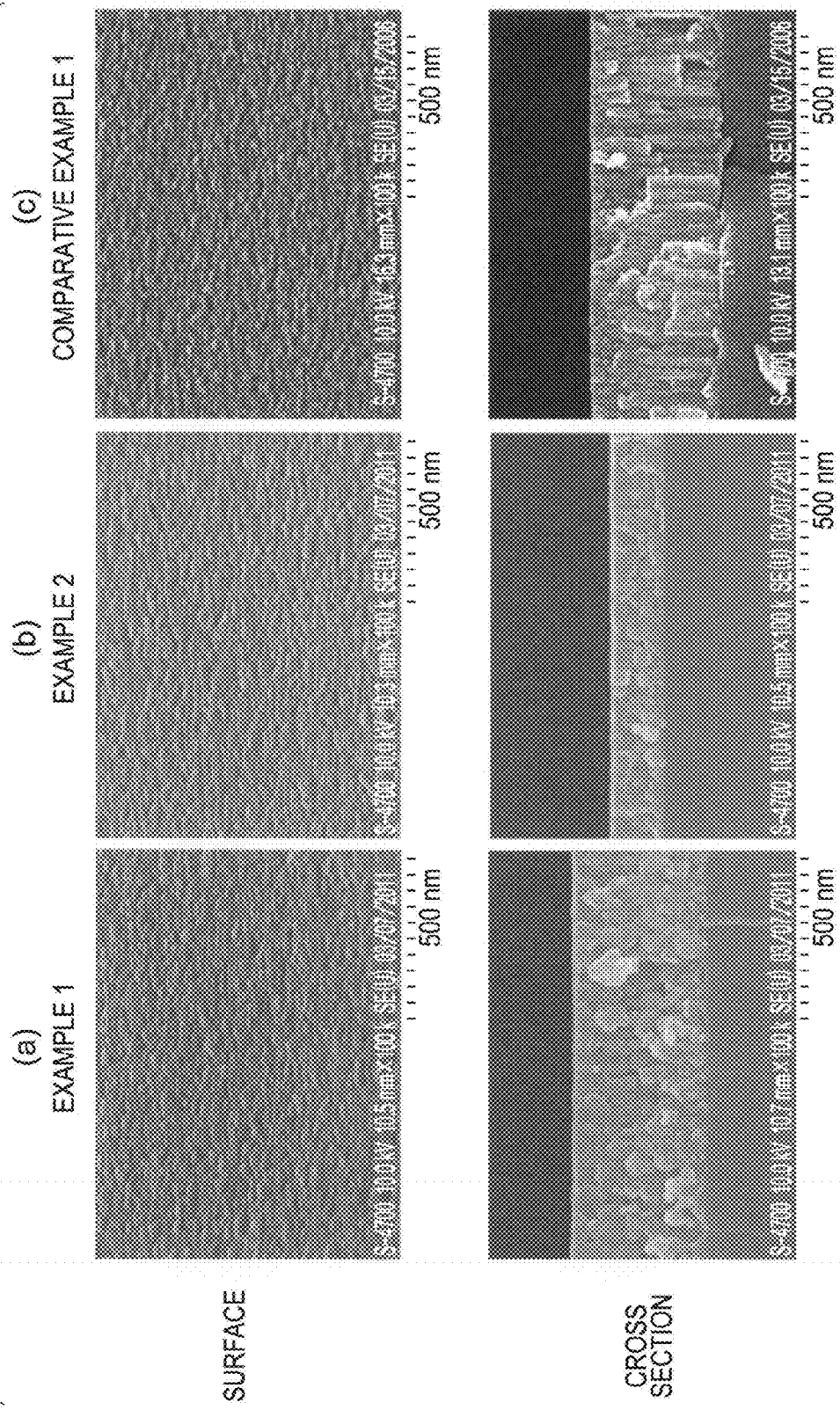

LIQUID EJECTING HEAD, LIQUID EJECTING APPARATUS, PIEZOELECTRIC ELEMENT, AND METHODS OF MANUFACTURING LIQUID EJECTING HEAD, LIQUID EJECTING APPARATUS, AND PIEZOELECTRIC ELEMENT

BACKGROUND

1. Technical Field

The present invention relates to a liquid ejecting head including a piezoelectric element provided with a vibrating plate including a zirconium oxide layer, a liquid ejecting apparatus, a piezoelectric element, a method of manufacturing a liquid ejecting head including a piezoelectric element provided with a vibrating plate including a zirconium oxide layer, a method of manufacturing a liquid ejecting apparatus, and a method of manufacturing a piezoelectric element.

2. Related Art

As a piezoelectric element used for a piezoelectric device, there is a piezoelectric material having an electromechanical transduction function, for example a material configured by interposing a ferroelectric layer formed of a crystallized dielectric material between two electrodes, and for such a piezoelectric element, a piezoelectric element in which a zirconium oxide ($ZrO_2$) layer is provided as a part of a vibrating plate is known.

A method of forming a metal zirconium layer with a sputtering method or the like, and performing thermal oxidation of the metal zirconium layer to form a zirconium oxide layer is proposed (for example, see JP-A-2005-294438).

However, in the piezoelectric element with such a structure, adhesion of the zirconium oxide layer and a first electrode provided on an upper portion thereof or adhesion of the zirconium oxide layer and a silicon oxide film which is a base thereof is not sufficient, such that reliability is decreased. In addition, such problems exist not only an actuator device mounted on a liquid ejecting head such as an ink jet-type recording head, but such problems also exist in an actuator device mounted on other devices, in the same manner.

SUMMARY

An advantage of some aspects of the invention is to provide a liquid ejecting head, a liquid ejecting apparatus, and a piezoelectric element with excellent adhesion with a base layer of a vibrating plate or a first electrode.

In addition, another advantage of some aspects of the invention is to provide a method of manufacturing a liquid ejecting head, a method of manufacturing a liquid ejecting apparatus, and a method of manufacturing a piezoelectric element including a zirconium oxide layer with excellent adhesion with a base layer of a vibrating plate or an electrode.

According to an aspect of the invention, there is provided a liquid ejecting head including a piezoelectric element which includes a piezoelectric layer and electrodes provided on the piezoelectric layer on an upper portion of a zirconium oxide layer, in which the zirconium oxide layer is formed of granular crystal grains.

According to another aspect of the invention, there is a method of manufacturing a liquid ejecting head including a piezoelectric element which includes a piezoelectric layer and electrodes provided on the piezoelectric layer on an upper portion of a zirconium oxide layer, the method including applying a precursor solution and crystallizing a coated film when forming the zirconium oxide layer.

According to the invention, since it is possible to form a dense zirconium oxide layer, it is possible to improve adhesion of the zirconium oxide layer and a base layer, or an upper layer, for example, electrodes, and it is possible to realize a liquid ejecting head having high durability.

Herein, it is preferable that the precursor solution include at least one selected from a group consisting of metal alkoxide containing Zr and metal carboxylate containing Zr. Accordingly, it is possible to further reliably form a zirconium oxide layer, and to improve adhesion.

In addition, according to still another aspect of the invention, there is a liquid ejecting apparatus including the liquid ejecting head according to the aspect described above.

In this aspect of the invention, it is possible to provide a liquid ejecting apparatus including a liquid ejecting head having excellent adhesion of the zirconium oxide layer and a base layer or an upper layer, and high durability.

In addition, according to still another aspect of the invention, there is a method of manufacturing a liquid ejecting apparatus including manufacturing a liquid ejecting head with the method of manufacturing the liquid ejecting head.

According to the aspect of the invention, it is possible to improve adhesion of the zirconium oxide layer and a base layer, and to realize a liquid ejecting apparatus having high durability.

Further, according to still another aspect of the invention, there is a piezoelectric element which is provided on an upper portion of a zirconium oxide layer and includes a piezoelectric layer and electrodes provided on the piezoelectric layer, in which the zirconium oxide layer is formed of granular crystal grains.

In this aspect of the invention, since it is possible to form a dense zirconium oxide layer, it is possible to improve adhesion of the zirconium oxide layer and a base layer or an upper layer, and it is possible to realize a piezoelectric element having high durability.

In addition, according to still another aspect of the invention, there is a method of manufacturing a piezoelectric element including a piezoelectric layer and electrodes provided on the piezoelectric layer on an upper portion of a zirconium oxide layer, the method including: applying a precursor solution and crystallizing a coated film when forming the zirconium oxide layer.

According to the aspect of the invention, it is possible to improve adhesion of a zirconium oxide layer and a base layer, and to realize a piezoelectric element having high durability.

In addition, according to the aspect of the invention, there is the method of manufacturing a piezoelectric element in which the precursor solution includes at least one selected from a group consisting of metal alkoxide containing Zr and metal carboxylate containing Zr.

According to the aspect of the invention, it is possible to further reliably form a zirconium oxide layer, and to improve adhesion with a base layer.

BRIEF DESCRIPTION OF THE DRAWINGS

The invention will be described with reference to the accompanying drawings, wherein like numbers reference like elements.

FIGS. 7A to 7C are cross-sectional views showing a manufacturing step of a recording head according to Embodiments 1 and 3.

FIGS. 9A to 9C show pictures obtained by capturing Examples 1 and 2 and Comparative Example 1 with an SEM.

DESCRIPTION OF EXEMPLARY EMBODIMENTS

Hereinafter, the invention will be described in detail based on Embodiments.

Embodiment 1

Figure 1:
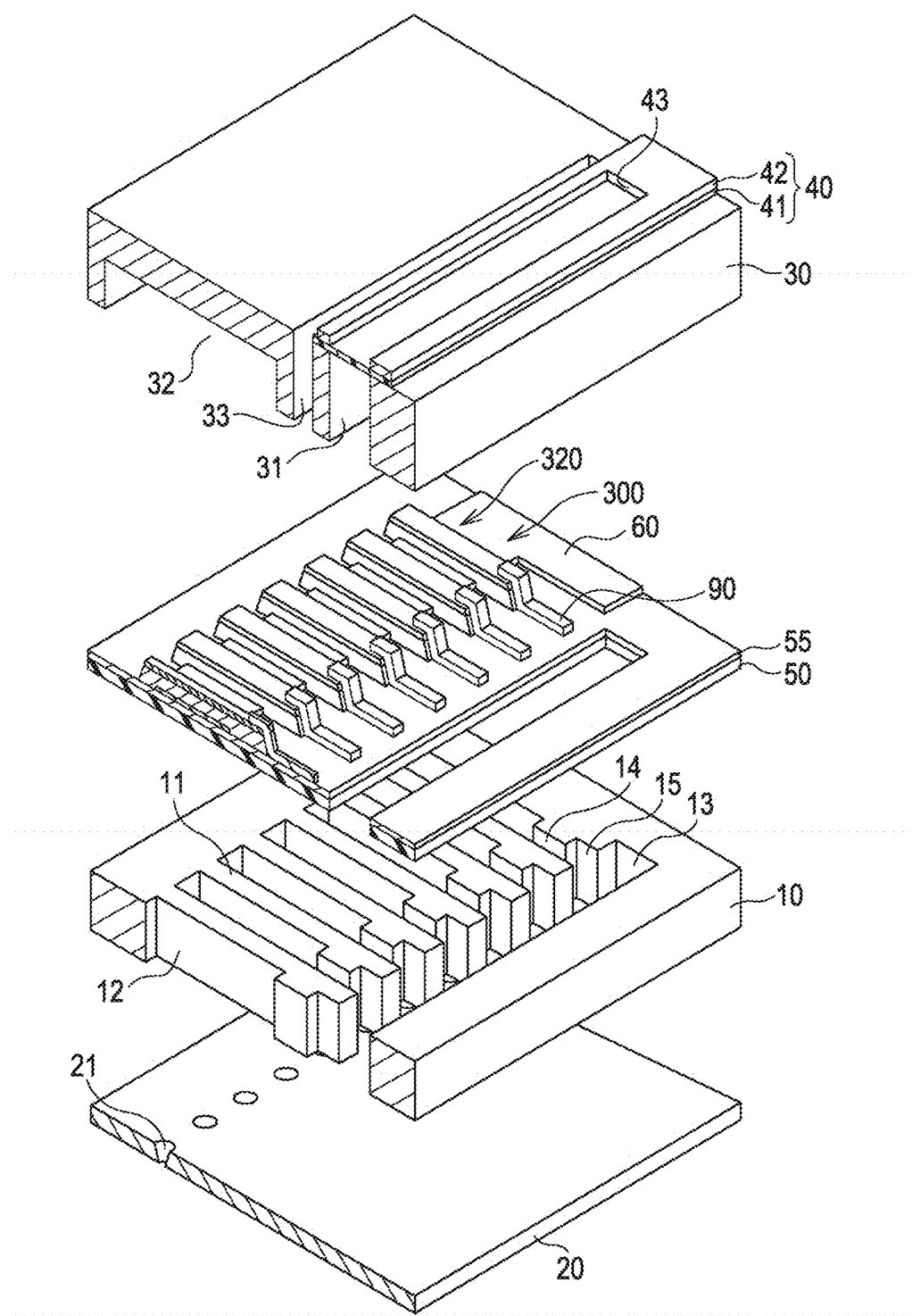
FIG. 1 is an exploded perspective view showing a schematic configuration of a recording head according to Embodiments 1 and 3.
Figure 2:
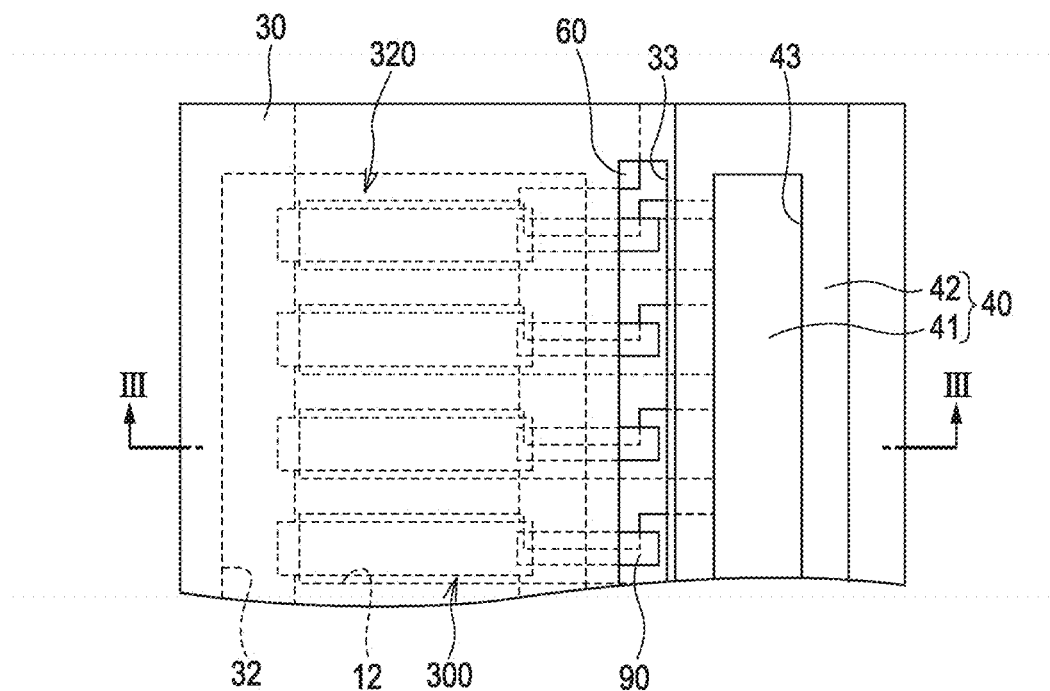
FIG. 2 is a plan view of main parts of a recording head according to Embodiments 1 and 3.
Figure 3:
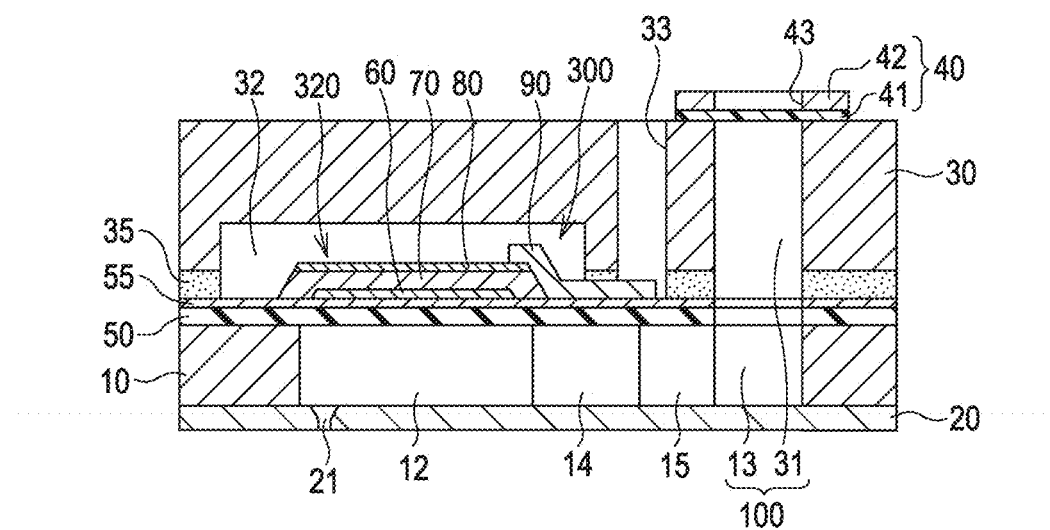
FIG. 3 is a cross-sectional view taken along line III-III in FIG. 2 of a recording head according to Embodiments 1 and 3.

FIG. 1 is an exploded perspective view showing a schematic configuration of an ink jet-type recording head which is an example of a liquid ejecting head including an actuator device according to Embodiment 1 of the invention, FIG. 2 is a plan view of main parts of the ink jet-type recording head, and FIG. 3 is a cross-sectional view taken along line III-III of FIG. 2.

As shown in the drawings, in the embodiment, a flow path forming substrate 10 is formed of a silicon single-crystal substrate with a plane orientation (110), and an elastic film 50 having a thickness of 0.5 μm to 2 μm which is configured of silicon dioxide ($SiO_2$) which is previously formed by thermal oxidation is formed on one surface thereof. A plurality of pressure generating chambers 12 which are partitioned by walls 11 are provided in parallel to each other arranged in a first direction which is a width direction (short direction) on the flow path forming substrate 10. In addition, a communicating unit 13 is formed on a region outside of a longitudinal direction of the pressure generating chambers 12 of the flow path forming substrate 10, that is, a second direction perpendicular to the first direction, and the communicating unit 13 and each pressure generating chamber 12 are communicated with each other though ink supply paths 14 and communicating paths 15 provided for each of the pressure generating chambers 12. The communicating unit 13 configures a part of a manifold which is a common ink chamber for each pressure generating chamber 12 by communicating with a manifold unit 31 which is formed in a protection substrate which will be described later.

The ink supply paths 14 communicate with one end portion side of the respective pressure generating chambers in a longitudinal direction and have a smaller cross section area than the pressure generating chambers 12. For example, in the embodiment, the ink supply path 14 is formed to have a smaller width than the width of the pressure generating chamber 12 by narrowing the flow path to the pressure generating chamber 12 between a manifold 100 and each pressure generating chamber 12 in the width direction. As described above, in the embodiment, the ink supply path 14 is formed by narrowing the width of the flow path from one side, however, the ink supply path may be formed by narrowing the width of the flow path from both sides. Further, not only narrowing the width of the flow path, the ink supply path may be formed by narrowing from a thickness direction. Further, each communicating path 15 is communicated with the side of the ink supply path 14 opposite to the pressure generating chamber 12, and has a larger cross section area than the width direction (short direction) of the ink supply path 14.

In addition, a nozzle plate 20 in which nozzle openings 21 communicating with vicinities of end portions on the side of each pressure generating chamber 12 opposite to the ink supply paths 14 are formed, is fixed on a side of an opening surface of the flow path forming substrate 10, by an adhesive, a thermal welding film, or the like. The nozzle plate 20 is formed of glass ceramics, a silicon single-crystal substrate, stainless steel, or the like, for example.

On the other hand, the elastic film 50 which is formed of silicon dioxide and has a thickness of about 1.0 μm, for example, is formed as described above, on the side opposite to the opening surface of the flow path forming substrate 10, and a zirconium oxide layer 55 which is formed of zirconium oxide ($ZrO_2$) and has a thickness of about 0.1 μm to 0.5 μm, for example, is formed in a laminated manner, on the elastic film 50.

The zirconium oxide layer 55 of the embodiment is formed of granular crystal grains, as will be described later. Since the zirconium oxide layer 55 formed of such granular crystal grains is formed to be significantly dense, adhesion with a base layer and electrodes provided on the upper portion or the lower portion of the zirconium oxide layer 55 and durability are improved.

A method of manufacturing such zirconium oxide layer 55 is not particularly limited, however, suitably, the zirconium oxide layer can be formed with a liquid phase method. That is, the zirconium oxide layer is formed by applying a precursor solution including metal alkoxide or metal carboxylate containing Zr on the flow path forming substrate 10 including the elastic film 50, and then, performing a drying step, a degreasing step, a preliminary baking step, and a proper baking step. According to the liquid phase method, since a vacuum device or the like is not necessary compared to a gas phase method, it is advantageous since environmental loads are small and low cost is realized even with mass production, however, as will be described later, the zirconium oxide layer may be formed by a gas phase method as long as the layer is formed of granular crystal grains.

In addition, a piezoelectric element 300 which is formed of a first electrode film 60 having a thickness of about 0.03 μm to 0.2 μm, for example, a piezoelectric layer 70 having a thickness of about 0.5 μm to 5 μm, for example, and a second electrode film 80 having a thickness of about nm to 200 nm, for example, is formed on the zirconium oxide layer 55.

Herein, the piezoelectric element 300 is referred to a part including the first electrode film 60, the piezoelectric layer 70, and the second electrode film 80. In general, any one electrode of the piezoelectric element 300 is set as a common electrode, and the other electrode and the piezoelectric layer 70 are patterned for each pressure generating chamber 12. Herein, a portion which is configured of one electrode and the piezoelectric layer 70 which are patterned and in which a piezoelectric strain is generated due to voltage applied to both electrodes, is called a piezoelectric active unit 320. In the embodiment, the first electrode film 60 is set as a common electrode of the piezoelectric element 300, and the second electrode film 80 is set as a separated electrode of the piezoelectric element 300, however, it is no problem to change this due to circumstances of the driving circuits or the wiring. In any case, the piezoelectric active unit 320 is formed for each pressure generating chamber 12. In addition, in the embodiment, as shown in FIG. 3, the first electrode film 60, the piezoelectric layer 70, and the second electrode film 80 are patterned so that the width of the second electrode film 80 side becomes narrow, and the side surface thereof is set to be an inclined surface. In addition, herein, the piezoelectric element 300 and a vibrating plate which generates displacement by driving of the piezoelectric element 300 are collectively referred to as a piezoelectric element, and are also referred to as an actuator device, in some cases. In the example described above, the elastic film 50, the zirconium oxide layer 55, and the first electrode film 60 are operated as a vibrating plate, however, it is not limited thereto, and the zirconium oxide layer 55, and the first electrode film 60 may be operated as a vibrating plate, without providing the elastic film 50.

The first electrode film 60 is provided on the zirconium oxide layer 55. As the first electrode film 60 of the embodiment, a laminated electrode structure of various metal such as iridium (Ir), platinum (Pt), titanium (Ti), or tungsten (W), alloy thereof, conductive complex oxide such as $LaNiO_3$ or $SrRuO_3$, and various metal films can be used.

In addition, as a material (piezoelectric material) of the piezoelectric layer 70 configuring the piezoelectric element 300 in the embodiment, for example, a ferroelectric piezoelectric material such as lead zirconate titanate (PZT) or a relaxor ferroelectric to which metal such as niobium, nickel, magnesium, bismuth or yttrium is added, is used.

In addition, the piezoelectric layer 70 may be formed of a lead-free piezoelectric material, and as the lead-free piezoelectric material, bismuth ferrate (($BiFeO_3$), abbreviated as "BFO"), barium titanate (($BaTiO_3$), abbreviated as "BT"), potassium sodium niobate ((K, Na)$NbO_3$) abbreviated as "KNN"), sodium potassium lithium niobate ((K, Na, Li)($NbO_3$)), sodium potassium lithium tantalate niobate ((K, Na, Li)(Nb, Ta)$O_3$), potassium bismuth titanate (($Bi_{1/2}K_{1/2}$)$TiO_3$, abbreviated as "BKT"), sodium bismuth titanate (($Bi_{1/2}Na_{1/2}$) $TiO_3$, abbreviated as "BNT"), bismuth manganate ($BiMnO_3$, abbreviated as "BM"), composite oxide having a perovskite structure containing bismuth, potassium, titanium, and iron (x [($Bi_xK_{1-x}$)$TiO_3$]-(1-x) [$BiFeO_3$], abbreviated as "BKT-BF"), or a composite oxide having a perovskite structure containing bismuth, iron, barium and titanium, ((1-x) [$BiFeO_3$]-x [$BaTiO_3$], abbreviated as "BFO-BT"), or composite oxide to which metals such as manganese, cobalt, or chromium is added ((1-x) [Bi ($Fe_{1-y}M_y$) $O_3$]-x [$BaTiO_3$] (M is Mn, Co is Cr)) can be used.

In addition, as the second electrode film 80, any of various metals such as Ir, Pt, W, tantalum (Ta), or molybdenum (Mo) may be used, and an alloy thereof or metal oxide such as iridium oxide is used.

Lead electrodes 90 formed of gold (Au) or the like, for example, which are extracted from the vicinity of the end portion of the ink supply path 14 side and which extend to an upper portion of the zirconium oxide layer 55 are connected to each second electrode film 80 which is a separated electrode of the piezoelectric element 300. The voltage is selectively applied to each piezoelectric element 300 through the lead electrodes 90.

A protection substrate 30 including a piezoelectric element holding unit 32 which includes a space in an extent of not disturbing the motion of the piezoelectric element 300 on a region opposed to the piezoelectric element 300, is adhered onto the upper portion of the flow path forming substrate 10 on which the piezoelectric element 300 is formed, through an adhesive 35. In addition, the piezoelectric element holding unit 32 may be obtained as long as a space in an extent of not disturbing the motion of the piezoelectric element 300 is included, and the space may be hermetically sealed or may not be hermetically sealed.

In addition, in the protection substrate 30, the manifold unit 31 is formed on a region opposing to the communication unit 13, and, as described above, the manifold unit 31 configures the manifold 100 which is a common ink chamber for each pressure generating chamber 12 by communicating with the communicating unit 13 of the flow path forming substrate 10. Further, a penetration hole 33 which penetrates the protection substrate 30 in the thickness direction is provided in a region of the protection substrate 30 between the piezoelectric element holding unit 32 and the manifold unit 31, and a part of the first electrode film 60 and a tip portion of the lead electrode 90 are exposed in the penetration hole 33.

In addition, a driving circuit (not shown) which drives the piezoelectric element 300 is fixed onto the protection substrate 30, and the driving circuit and the lead electrodes 90 are electrically connected to each other through a connection wire formed of a conductive wire such as a bonding wire, or the like.

As the protection substrate 30, a material having substantially the same coefficient of thermal expansion as the flow path forming substrate 10, for example, glass, ceramics or the like is preferably used, and in the embodiment, the protection substrate is formed by using a silicon single-crystal substrate which is the same material as the flow path forming substrate 10.

A compliance substrate 40 formed of a sealing film 41 and a fixing plate 42 is adhered to the upper portion of the protection substrate 30. Herein, the sealing film 41 is formed of a material having low rigidity, and flexibility (for example, a polyphenylene sulfide (PPS) film having a thickness of 6 μm), and one surface of the manifold unit 31 is sealed by the sealing film 41. In addition, the fixing plate 42 is formed with a hard material such as metal (for example, stainless steel (SUS) having a thickness of 30 μm, or the like). Since a region of the fixing plate 42 opposing to the manifold 100 is an opening portion 43 where the plate is completely removed in the thickness direction, one surface of the manifold 100 is sealed by only the sealing film 41 having flexibility.

In an ink jet-type recording head of the embodiment, after introducing ink from an external ink supply unit (not shown) and filling the inner portion from the manifold 100 to the nozzle opening 21 with the ink, voltage is applied between each of the first electrode film 60 and the second electrode film 80 corresponding to pressure generating chambers 12 according to a recording signal from the driving circuit, pressure inside each pressure generating chamber 12 is increased by flexural deformation of the elastic film 50 formed of a silicon oxide film 51, the zirconium layer 55, the first electrode film 60, and the piezoelectric layer 70, and ink droplets are discharged from the nozzle opening 21. In the embodiment, since adhesion of the first electrode film 60 or the elastic film 50 and the zirconium oxide layer 55 is excellent, the first electrode film 60 or the elastic film 50 is not peeled off from the zirconium oxide layer 55 even with the flexural deformation by driving the actuator device, and thus excellent durability is obtained.

Figure 4A:
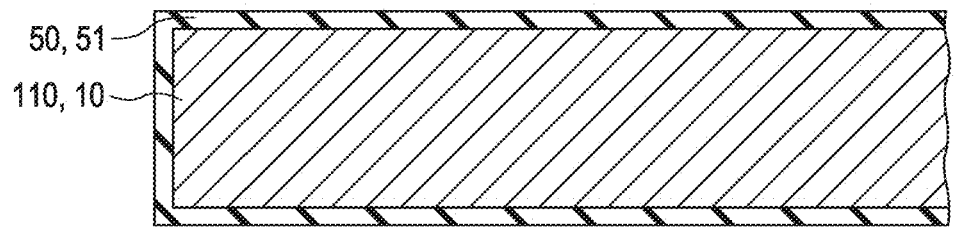
FIGS. 4A to 4C are cross-sectional views showing a manufacturing step of a recording head according to Embodiments 1 and 3.

Herein, a method of manufacturing the ink jet-type recording head will be described with reference to FIGS. 4A to 8B. FIGS. 4A to 8B are cross-sectional views of the pressure generating chamber in a longitudinal direction. First, as shown in FIG. 4A, a wafer 110 for a flow path forming substrate which is a silicon wafer is subjected to thermal oxidation with a diffusion furnace at about 1100° C., and the silicon dioxide film 51 configuring the elastic film 50 is formed on the surface thereof.

Figure 4B:
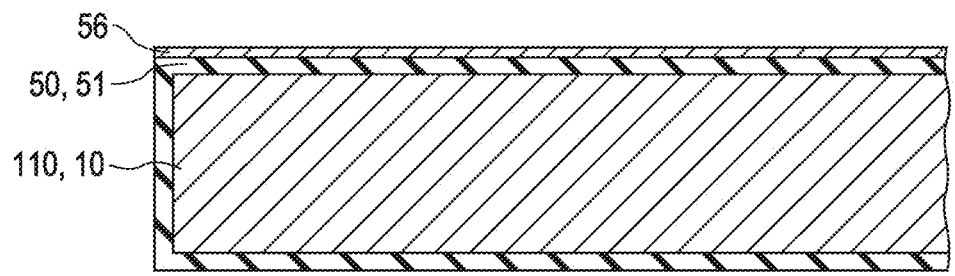
Figure 4C:
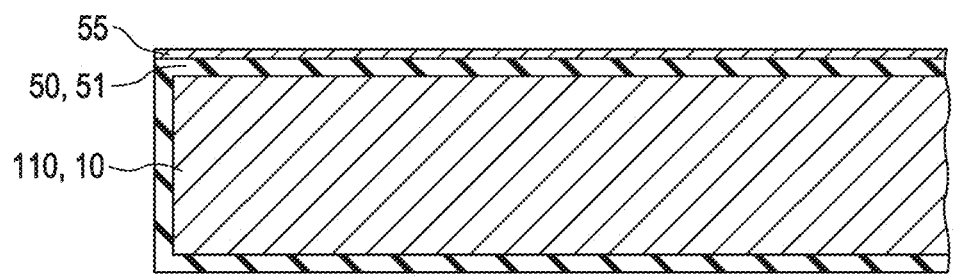

Then, as shown in FIGS. 4B and 4C, the zirconium oxide layer 55 formed of granular crystal grains is formed on the silicon oxide film 51. In the embodiment, the zirconium oxide layer 55 formed of granular crystal grains is formed by a liquid phase method. That is, as shown in FIG. 4B, a precursor layer 56 is formed by applying a precursor solution of zirconium oxide on the silicon oxide film 51, and the zirconium oxide layer 55 is formed by crystallizing the precursor layer 56 (FIG. 4C).

The precursor solution of the zirconium oxide used for the liquid phase method contains metal alkoxide containing Zr and metal carboxylate containing Zr.

Herein, as the metal alkoxide, tetramethoxy zirconium, tetraethoxy zirconium, tetrapropoxy zirconium, tetraisopropoxy zirconium, tetrabutoxy zirconium, tetrahexyl zirconium, tetrakis(2,4-pentanedionato) zirconium, or the like is used, however, it is not particularly limited as long as it is alkoxide containing Zr.

In addition, as the metal carboxylate, zirconium acetate, zirconium propionate, zirconium tributoxy propionate, zirconium tetrakis (butanoic acid), 2 ethylhexanoic acid zirconium, zirconium stearate, or the like is used, however, it is not particularly limited as long as it is carboxylate containing Zr.

The precursor solution is a solution obtained by dissolving the metal alkoxide or the metal carboxylate in a solvent containing carboxylic acid. As the carboxylic acid, it is not particularly limited, and for example, acetic acid, propionic acid, butanoic acid, or the like is used, however, acetic acid is preferable to be used.

In addition, in order that the precursor solution can improve a coating property and easily form a relatively thick film, it is preferable for the solution to contain a thickener. As the thickener, it is possible to use an organic high-molecular compound, for example, and polyethylene glycol, polyvinyl acetate, hydroxypropyl cellulose, polyethylene glycol monomethyl ether, polypropylene glycol, polyvinyl alcohol, polyacrylic acid, polyamides, polyamic acid, acetyl cellulose, or the like is used, however, it is preferable to use polyethylene glycol.

The precursor solution described above is a precursor solution in a case where the zirconium oxide layer is a $ZrO_2$ layer, however, the zirconium oxide layer 55 may be an yttria stabilized zirconia (YSZ) layer, and the yttria stabilized zirconia (YSZ) is contained therein. The precursor solution in a case of forming the yttria stabilized zirconia (YSZ) layer by a liquid phase method, is a precursor solution obtained by adding a solution containing yttrium ion in metal alkoxide or metal carboxylate containing Zr. Herein, as the solution containing yttrium ion, it is not particularly limited, however, for example, an yttrium acetic acid solution, an yttrium propionic acid solution, an yttrium chloride solution, yttrium nitric acid solution, or the like is used.

Hereinafter, a forming step of the zirconium oxide layer 55 will be described.

First, metal alkoxide or metal carboxylate and the thickener are added to carboxylic acid, and then, water ($H_2O$) is added, heating stirring at about 70° C. for about 2 hours is performed, and a uniform and clear precursor solution is obtained. The precursor solution is applied on the substrate by a spin coating method at a rotation speed of 1400 rpm (applying step). Next, the solution applied to the substrate is heated to 160° C. to 200° C., and dried for about 5 minutes, and a dried film is obtained (drying step). Degreasing is performed by heating the dried film to 375° C. to 415° C., and holding for about 5 minutes (degreasing step). In addition, the degreasing herein is separating organic components included in the dried film as $NO_2$, $CO_2$, $H_2O$, for example. When a thicker zirconium oxide layer 55 is desired, after the degreasing step, the process returns to the initial applying step, and then, the drying step and the degreasing step may be repeated. After the degreasing step, the dried film is heated to 750° C. to 850° C., held for about 3 minutes, and crystallized (preliminary baking step). When a further thicker zirconium oxide layer 55 is desired, after the preliminary baking step, the process returns to the initial applying step, and then, the drying step, the degreasing step, and the preliminary baking step may be repeated. After the degreasing step, the film is heated to 800° C. to 950° C. and held for about 1 hour, and thus, the zirconium oxide layer 55 is formed (proper baking step). In addition, as a heating device used for the drying step, the degreasing step, the preliminary baking step, and the proper baking step, an RTA (Rapid Thermal Annealing) device which heats by emitting an infrared lamp or a hot plate is used, for example.

In the embodiment, in order to form the zirconium oxide layer 55 having a thickness of 400 nm, the applying step, the drying step, and the degreasing step are repeated twice, and then, after performing the preliminary baking step, the applying step, the drying step, and the degreasing step, and the preliminary step are repeated. In addition, in order to form the zirconium oxide layer 55 having a thickness of 200 nm, the applying step, the drying step, and the degreasing step are repeated twice.

In formation of the zirconium oxide layer 55 due to the liquid phase method, as described above, the applying step, the drying step, and the degreasing step are repeated, and after performing the preliminary baking step, the applying step, the drying step, and the degreasing step are repeated, and thus, it is possible to easily form a precursor film having a desired thickness. In addition, compared to the gas phase method such as the sputtering method, in the formation by the liquid phase method, it is advantageous since environmental loads are small, it is suitable for mass production, and reduction of manufacturing cost is realized.

In the related art, after forming a zirconium oxide layer by a gas phase method such as a sputtering method, as will be described later, it is known that a zirconium oxide layer formed by thermal oxidation of the zirconium oxide is formed of columnar crystals.

The zirconium oxide layer 55 formed of granular crystal grains of the invention is differentiated from the zirconium oxide layer formed of columnar crystals of the related art described above, and it is found that the zirconium oxide layer 55 is a denser layer compared to the zirconium oxide layer formed of columnar crystals. That is, as will be described later, if the zirconium oxide layer 55 formed of granular crystal grains of the invention is observed with a scanning electron microscope (SEM), uniform granular crystal grains are laminated in a state of being closely spread, and space is almost not observed, and thus high density is obtained. On the other hand, since some spaces are observed in the zirconium oxide layer formed of columnar crystals, the high density as the zirconium oxide layer 55 formed of granular crystal grains of the present invention is not obtained. In the zirconium oxide layer 55 formed of granular crystals as described above, adhesion with the first electrode film 60 or the elastic film 50 is high and durability is excellent.

In addition, even with the gas phase method such as the sputtering method, for example, by forming the film by devising forming conditions of the zirconium oxide layer, it is possible to form a zirconium oxide layer formed of high-dense granular crystals, the zirconium oxide film formed of granular crystals by the gas phase method described above is also included in the range of the invention, and it is needless to say that it is possible to realize a film with high density and excellent adhesion in the same manner.

In addition, in order to determine the adhesion of the zirconium oxide layer 55 and the first electrode film 60 or the elastic film 50 of the invention, as will be described later, when measuring scratch strength (mN) of the zirconium oxide layer using a thin film scratch tester, it is found that the scratch strength is significantly strong compared to the zirconium oxide layer formed of columnar crystals. In the zirconium oxide layer 55 formed of granular crystals of the invention, scratch strength is significantly strong, and adhesion is significantly excellent.

Figure 5A:
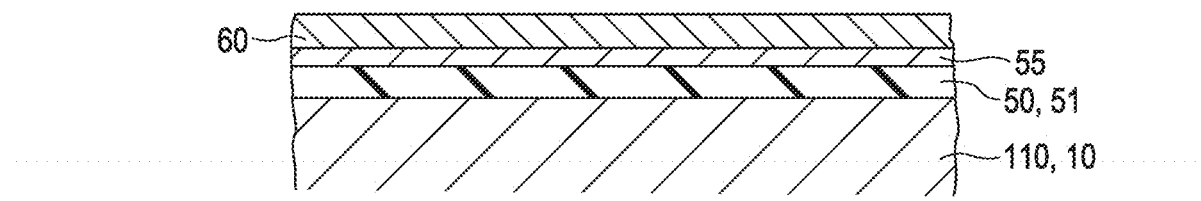
FIGS. 5A to 5C are cross-sectional views showing a manufacturing step of a recording head according to Embodiments 1 and 3.

After forming the zirconium oxide layer 55, for example, by laminating titanium (Ti), platinum (Pt), and iridium (Ir) on the zirconium oxide layer 55 by the sputtering method, as shown in FIG. 5A, the first electrode film 60 is formed.

Next, the piezoelectric layer 70 formed of lead zirconate titanate (PZT) is formed on the first electrode film 60. Herein, in the embodiment, the piezoelectric layer 70 is obtained by dissolving and dispersing the metal organic substance in a solvent, that is, the piezoelectric layer is formed of metal oxide by applying and drying sol and gelating, and then, baking at a high temperature. That is to say, the piezoelectric layer 70 is formed using a sol-gel method. In addition, without being limited to the sol-gel method, for example, an MOD (Metal-Organic Decomposition) method or the like may be used. Further, other sputtering methods may be used.

Figure 5B:
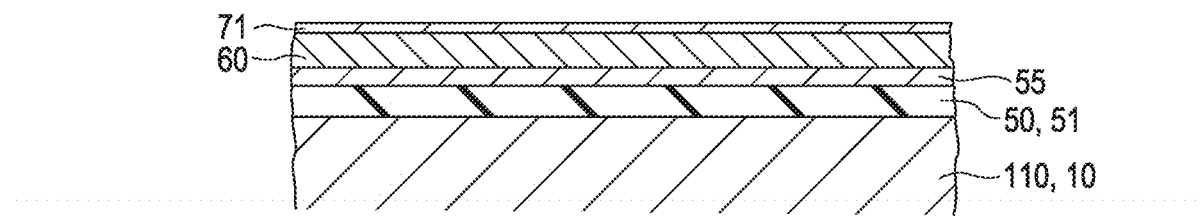

As a detailed forming procedure of the piezoelectric layer 70, first, as shown in FIG. 5B, a piezoelectric precursor film 71 which is a PZT precursor film is formed on the first electrode film 60. That is, the piezoelectric precursor film 71 is formed by applying sol (solution) containing a metal organic compound (lead zirconate titanate) on the flow path forming substrate 10 on which the first electrode film 60 is formed by the spin coating method or the like (applying step). Then, the piezoelectric precursor film 71 is heated to a predetermined temperature and dried for a given time (drying step). Next, the dried piezoelectric precursor film 71 is subjected to degreasing by heating to a predetermined temperature and holding for a given time (degreasing step). In addition, the degreasing herein is separating organic components included in the piezoelectric precursor film 71 as $NO_2$, $CO_2$, $H_2O$, for example.

Figure 5C:
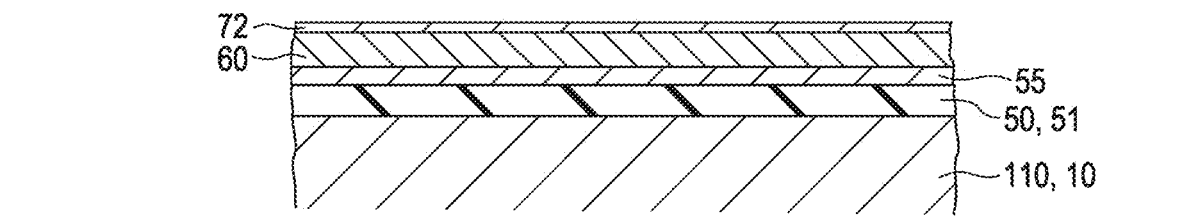

Then, as shown in FIG. 5C, the piezoelectric precursor film 71 is heated to a predetermined temperature and held for a given time to be crystallized, and thus, a piezoelectric film 72 is formed (baking step). In addition, as a heating device used for the drying step, the degreasing step, and the baking step, an RTA (Rapid Thermal Annealing) device which heats by emitting an infrared lamp or a hot plate is used, for example.

Figure 6A:
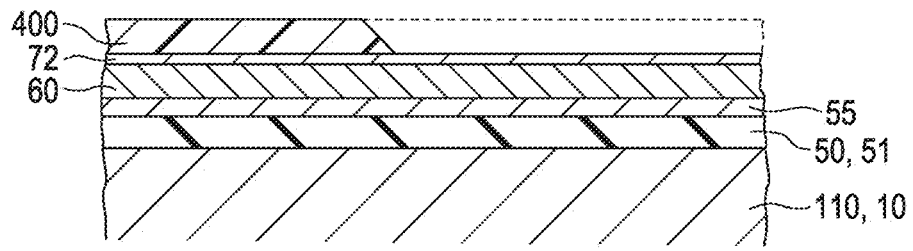
FIGS. 6A to 6C are cross-sectional views showing a manufacturing step of a recording head according to Embodiments 1 and 3.
Figure 6B:
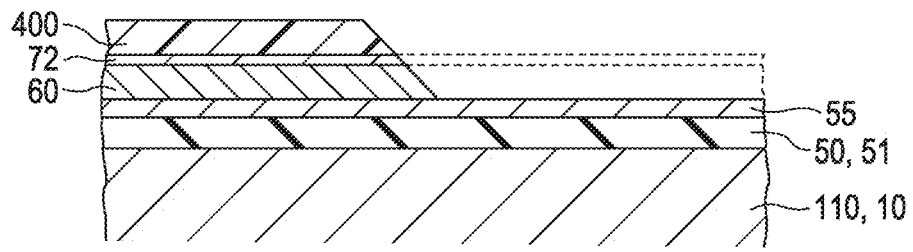

Next, as shown in FIG. 6A, a resist 400 is formed on the piezoelectric film 72 and patterned in a predetermined shape. Then, as shown in FIG. 6B, the first electrode film 60 and the first piezoelectric film 72 are patterned at the same time with the resist 400 as a mask, so that each side surface thereof is inclined.

Figure 6C:
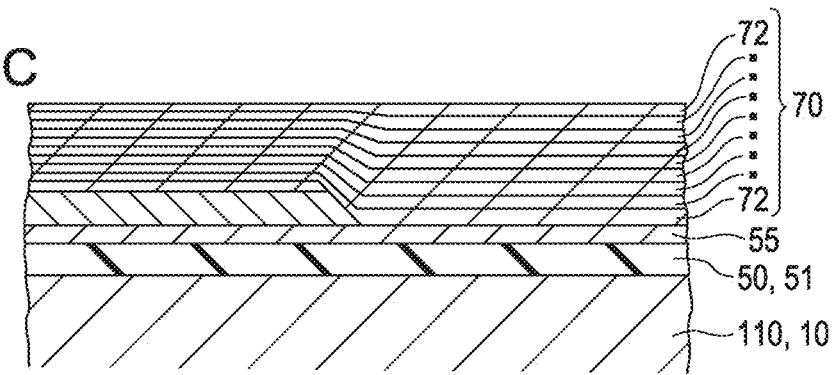

Next, after peeling off the resist 400, by repeating the piezoelectric film forming step including the applying step, the drying step, the degreasing step, and the baking step described above, several times, and forming the piezoelectric layer 70 formed of a plurality of piezoelectric films 72, the piezoelectric layer 70 having a predetermined thickness which is formed of the plurality of piezoelectric films 72 as shown in FIG. 6C is formed. For example, sol is applied to have a significantly thin thickness of the film for each time, and overall thickness of the piezoelectric layer 70 formed of the plurality of piezoelectric films is about 1 µm to 3 µm. In the embodiment, the piezoelectric films 72 are formed to be laminated, however, only one layer may be provided with a thicker thickness of one piezoelectric film 72. The piezoelectric layer 70 obtained as described above is flat and smooth and a protruding region does not exist.

After forming the piezoelectric layer 70, as shown in FIG. 7A, second electrode film 80 formed of iridium (Ir) is formed over the entire surface on the piezoelectric layer 70 by the sputtering method or the like, and patterned on the region opposing to each pressure generating chamber 12, and the piezoelectric element 300 formed of the first electrode film 60, the piezoelectric layer 70, and the second electrode film 80 is formed. In addition, the patterning of the piezoelectric layer 70 and the second electrode film 80 can be collectively performed by dry etching through a resist (not shown) formed in a predetermined shape. In the dry etching described above, when the side surface of the resist is previously inclined, the piezoelectric layer 70 and the second electrode film 80 are patterned so that the width of the second electrode film 80 side becomes narrow, and the side surface thereof becomes an inclined surface.

Next, as shown in FIG. 7B, after forming the lead electrode 90 formed of gold (Au), for example, over the entire surface of the wafer 110 for a flow path forming substrate, and patterning is performed for each piezoelectric element 300 through a mask pattern (not shown) formed of the resin, for example.

Then, as shown in FIG. 7C, a wafer 130 for protection substrate which is a silicon wafer and which becomes the plurality of protection substrates 30 is adhered to the piezoelectric element 300 side of the wafer 110 for a flow path forming substrate through the adhesive 35. In addition, since the wafer 130 for the protection substrate has a thickness of about several hundred µm, for example, rigidity of the wafer 110 for a flow path forming substrate significantly improves by adhering the wafer 130 for the protection substrate.

Figure 8A:
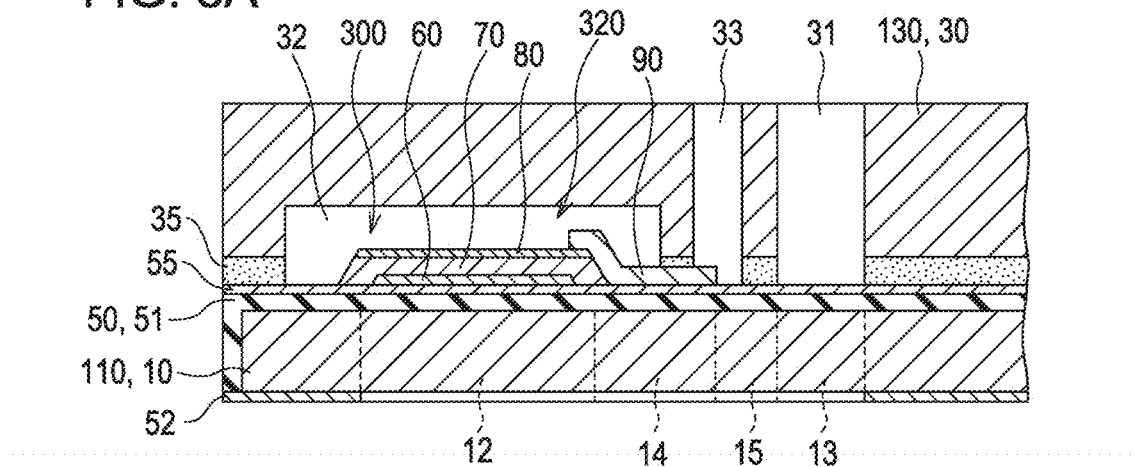
FIGS. 8A and 8B are cross-sectional views showing a manufacturing step of a recording head according to Embodiments 1 and 3.

Next, as shown in FIG. 8A, the wafer 110 for a flow path forming substrate is set to be thin to have a thickness of some extent. In addition, a mask film 52 is newly formed on the wafer 110 for a flow path forming substrate, for example, and patterned in a predetermined shape.

Figure 8B:
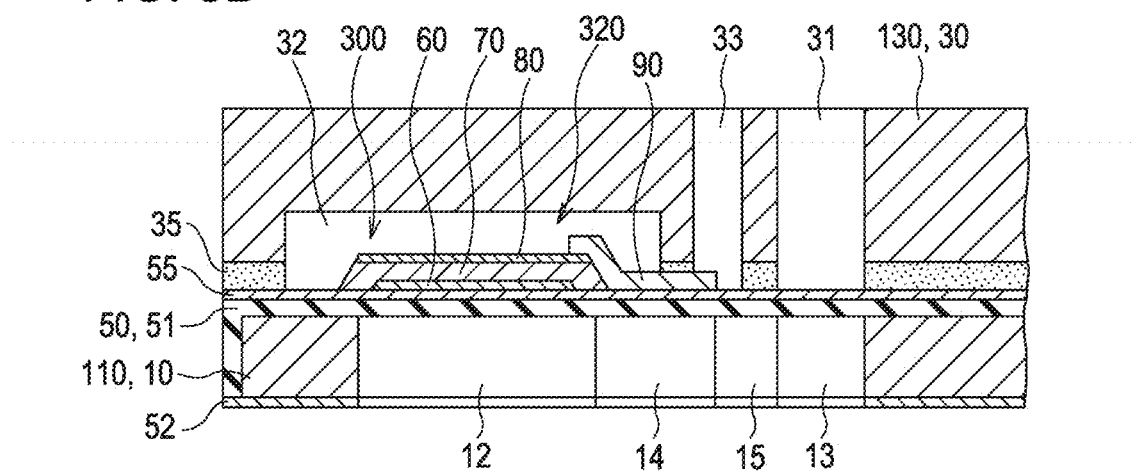

As shown in FIG. 8B, the pressure generating chamber 12, the communicating unit 13, the ink supply path 14, and the communicating path 15 corresponding to the piezoelectric element 300 are formed by performing anisotropic etching (wet etching) of the wafer 110 for a flow path forming substrate using an alkali solution such as KOH, through the mask film 52.

After that, unnecessary parts of the outer periphery portion of the wafer 110 for a flow path forming substrate and the wafer 130 for a protection substrate are removed by cutting by dicing or the like, for example. After removing the silicon oxide film 51 on the surface of the wafer 110 for a flow path forming substrate on the side opposite to the wafer 130 for a protection substrate, the nozzle plate 20 on which the nozzle openings 21 are provided is adhered to the wafer thereof and the compliance substrate 40 is adhered to the wafer 130 for a protection substrate, and then, the wafer 110 for a flow path forming substrate is divided to the flow path forming substrate 10 and the like with one chip size shown in FIG. 1, and thus, the ink jet-type recording head of the embodiment is obtained.

Hereinafter, the invention will be further described in detail based on Examples and Comparative Examples.

Example 1

The wafer 110 for a flow path forming substrate was subjected to thermal oxidation in a diffusion furnace at about 1100° C., a silicon oxide film 51 having a thickness of 1 μm was formed, and a zirconium oxide layer 55 having a thickness of 400 nm was formed on the silicon oxide film 51 by the gas phase method. The formation of the zirconium oxide layer 55 was performed with the following procedure.

First, 79.32 g of zirconium acetate (manufactured by Sigma-Aldrich Co. LLC.) (molecular weight of 327.4) which is a raw material of the zirconium oxide and 44.39 g of polyethylene glycol (average molecular weight of 600) which is a thickener were added to 66.58 g of acetic acid (guaranteed grade, manufactured by Kanto Chemical Co., Inc.), and then, 44.39 g of water was added thereto, heating and stirring at 60° C. for about 1 hour was performed, and a uniform and clear precursor solution was obtained. After that, the precursor solution was applied on the substrate at a rotating speed of 1400 rpm by the spin coating method (applying step).

Next, the solution applied on the substrate was heated to 160° C., and dried for 5 minutes, and a dried film was obtained (drying step). Degreasing was performed by heating the dried film to 415° C. and holding for 5 minutes (degreasing step). After the degreasing step, the process returned to the initial applying step, and then the drying step and the degreasing step were performed. After that, the dried film was heated to 800° C. and held for 3 minutes to be crystallized (preliminary baking step).

After the preliminary baking step, the process returned to the initial applying step, and then, the drying step, the degreasing step, and the preliminary baking step were repeated twice. After that, by heating the film to 850° C. and holding for 60 minutes, the zirconium oxide layer was formed (proper baking step). In addition, as a heating device used for the drying step, the degreasing step, the preliminary baking step, and the proper baking step, an RTA (Rapid Thermal Annealing) device which heats by emitting an infrared lamp was used, for example.

Example 2

The zirconium oxide layer 55 having a thickness of 200 nm was formed on the silicon oxide film 51 by the gas phase method. In Example 1, the applying step, drying step, degreasing step, and the preliminary baking step were repeated twice, after repeating the applying step, drying step, and degreasing step twice, however, in Example 2, after repeating the initial applying step, drying step, and degreasing step twice, the process proceeded to the preliminary baking step and the proper baking step. Other conditions were same as Example 1.

Comparative Example 1

In Comparative Example 1, after forming a zirconium layer by the sputtering method, a zirconium oxide layer was formed by thermal oxidation of the zirconium layer. Hereinafter, the procedure is shown. First, the wafer 110 for a flow path forming substrate was subjected to thermal oxidation in a diffusion furnace at about 1100° C., a silicon oxide film 51 having a thickness of 1 μm was formed, and a zirconium layer having a thickness of 200 nm was formed on the silicon oxide film 51 by a DC sputtering method. After that, the wafer 110 for a flow path forming substrate on which the zirconium layer was formed was put in a thermal oxidation furnace heated to 700° C. or higher, and zirconium layer was subjected to thermal oxidation while continuously supplying oxidized gas containing oxygen at a flow rate of 15 liters/minutes, and a zirconium oxide layer was formed. In addition, a horizontal type furnace manufactured by Koyo Lindberg Ltd. was used for the thermal oxidation furnace.

Test Example 1

The crystal structures of the zirconium oxide layers of Examples 1 and 2 and Comparative Example 1 were observed using a scanning electron microscope (SEM).

The crystal structures of the zirconium oxide layer 55 having a thickness of 400 nm of Example 1, the zirconium oxide layer 55 having a thickness of 200 nm of Example 2, and the zirconium oxide layer 55 having a thickness of 400 nm of Comparative Example 1 are shown in FIGS. 9A, 9B, and 9C, respectively.

As a result, the cross section structure of the zirconium oxide layer 55 of Example 1 was in a state where uniform and granular crystal grains are closely spread, and the space was almost not observed. In addition, the zirconium oxide layer having a thickness of 200 nm of Example 2 was formed of more uniform and granular crystal grains than Example 1, and the space was almost not observed. On the other hand, the cross section structure of the zirconium oxide layer of Comparative Example 1 was formed of non-uniform columnar crystals, and some spaces were observed.

Accordingly, the zirconium oxide layer 55 formed of granular crystal grains has denser crystals than the columnar crystals, and if the layer is thinner, it was found that denser crystals were obtained.

In addition, in all surface structures of Examples 1 and 2 and Comparative Example 1, unevenness was not observed. It is preferable that the zirconium oxide layer 55 do not have unevenness. This is for making microfabrication with high precision possible in the subsequent forming step of the first electrode film 60. The surface structure thereof was excellent for the zirconium oxide layer 55 of Examples 1 and 2 and also the zirconium oxide layer 55 of Comparative Example 1.

Test Example 2

Scratch strength (mN) of the zirconium oxide layers of Examples 1 and 2, and the Comparative Example 1 were measured using a thin film scratch tester (product name: CSR-02 manufactured by Rhesca Co., Ltd.). The results thereof are shown in Table 1.

As a result, the scratch strength of both the zirconium oxide layer having a thickness of 400 nm of Example 1 and the zirconium oxide layer having a thickness of 200 nm of Example 2 were equal to or more than 1000 mN which is a measurement limit, however, the scratch strength of Comparative Example 1 was 300 mN to 600 mN. Accordingly, it was found that the zirconium oxide layer formed of granular crystal grains had significantly high adhesion compared to the zirconium oxide layer formed of columnar crystals.

In the liquid ejecting head, high resolution of arrangement of discharge ports which discharges each liquid droplet is realized every year to 300 dpi and to 600 dpi, and the strength larger than the scratch strength (300 mN) which is considered to be sufficient in the related art, is necessary, however, in the zirconium oxide layer formed of granular crystal grains, it is possible to obtain the scratch strength of equal to or more than 1000 mN which is a measurement limit, and it was found that excellent adhesion which can be applied to the liquid ejecting head with high resolution is obtained.

TABLE 1

|  | Example 1 | Example 2 | Comparative Example 1 |
|---|---|---|---|
| Scratch strength | Equal to or more than 1000 mN Measurement limit | Equal to or more than 1000 mN Measurement limit | 300 to 600 mN |

Hereinafter, the invention will be described in detail based on an embodiment.

Embodiment 3

FIG. 1 is an exploded perspective view showing a schematic configuration of the ink jet-type recording head which is an example of the liquid ejecting head including the actuator device according to Embodiment 1 of the invention, FIG. 2 is a plan view of main parts of the ink jet-type recording head, and FIG. 3 is a cross-sectional view taken along line III-III of FIG. 2.

As shown in the drawing, in the embodiment, a flow path forming substrate 10 is formed of a silicon single-crystal substrate with a plane orientation (110), and an elastic film 50 having a thickness of 0.5 μm to 2 μm which is configured of silicon dioxide ($SiO_2$) which is previously formed by thermal oxidation is formed on one surface thereof. A plurality of pressure generating chambers 12 which are partitioned by walls 11 are provided in parallel to each other in a first direction which is a width direction (short direction) of the pressure generating chambers 12 on the flow path forming substrate 10. In addition, a communicating unit 13 is formed on a region outside, in a longitudinal direction of the pressure generating chambers 12 of the flow path forming substrate 10, that is, a second direction perpendicular to the first direction, and the communicating unit 13 and each pressure generating chamber 12 are communicated with each other though ink supply paths 14 and communicating paths 15 provided for each of the pressure generating chambers 12. The communicating unit 13 configures a part of a manifold 100 which is a common ink chamber for each pressure generating chamber 12 by communicating with a manifold unit 31 which is a protection substrate which will be described later.

The ink supply paths 14 each communicate with one end portion side of a respective pressure generating chamber 12 in a longitudinal direction and have a smaller cross section areas than the pressure generating chamber 12. For example, in the embodiment, the ink supply path 14 is formed to have a smaller width than the width of the pressure generating chamber 12 by narrowing the flow path on the pressure generating chamber 12 between the manifold 100 and each pressure generating chamber 12 in the width direction. As described above, in the embodiment, the ink supply path 14 is formed by narrowing the width of the flow path from one side, however, the ink supply path may be formed by narrowing the width of the flow path from both sides. Further, not only narrowing the width of the flow path, the ink supply path may be formed by narrowing from a thickness direction. Further, each communicating path 15 is communicated with the side of the ink supply path 14 opposite to the pressure generating chamber 12, and has a larger cross section area than the width direction (short direction) of the ink supply path 14.

In addition, a nozzle plate 20 on which nozzle openings 21 communicating with vicinities of end portions on the side of each pressure generating chamber 12 opposite to the ink supply paths 14 is formed, and fixed on a side of an opening surface of the flow path forming substrate 10, by an adhesive, a thermal welding film, or the like. The nozzle plate 20 is formed of glass ceramics, a silicon single-crystal substrate, stainless steel, or the like, for example.

On the other hand, the elastic film 50 which is formed of silicon dioxide and has a thickness of about 1.0 μm, for example, is formed as described above, on the side opposite to the opening surface of the flow path forming substrate 10, and a zirconium oxide layer 55 which is formed of zirconium oxide ($ZrO_2$) and has a thickness of about 0.1 μm to 0.5 μm, for example, is formed in a laminated manner, on the elastic film 50.

The zirconium oxide layer 55 of the embodiment is formed by a liquid phase method as will be described later. That is, the zirconium oxide layer is formed by applying a precursor solution including metal alkoxide or metal carboxylate containing Zr on the flow path forming substrate including the elastic film 50, and then, performing a drying step, a degreasing step, a preliminary baking step, and a proper baking step. The detailed forming step of the zirconium oxide layer 55 will be described later. The zirconium oxide layer 55 formed by the liquid phase method described above has high adhesion with the first electrode film 60 or the elastic film 50 which is a base and has excellent durability. Accordingly, peeling of the first electrode film 60 or the elastic film 50 from the zirconium oxide layer 55 when driving the actuator device can be prevented.

In addition, the piezoelectric element 300 formed of the first electrode film 60 having a thickness of about 0.1 μm to 0.2 μm, for example, the piezoelectric layer 70 having a thickness of about 0.5 μm to 5 μm, for example, and the second electrode film 80 having a thickness of about 10 nm to 200 nm, for example, is formed on the zirconium oxide layer 55.

Herein, the piezoelectric element 300 is referred to a part including the first electrode film 60, the piezoelectric layer 70, and the second electrode film 80. In general, any one electrode of the piezoelectric element 300 is set as a common electrode, and the other electrode and the piezoelectric layer 70 are patterned for each pressure generating chamber 12. Herein, a portion which is configured of one electrode and the piezoelectric layer 70 which are patterned and in which a piezoelectric strain is generated due to voltage applied to both electrodes, is called a piezoelectric active unit 320. In the embodiment, the first electrode film 60 is set as a common electrode of the piezoelectric element 300, and the second electrode film is set as a separated electrode of the piezoelectric element 300, however, there is no problem to change this due to circumstances of the driving circuits or the wiring. In any case, the piezoelectric active unit 320 is formed for each pressure generating chamber 12. In addition, in the embodiment, as shown in FIG. 3, the first electrode film 60, the piezoelectric layer 70, and the second electrode film 80 are patterned so that the width of the second electrode film 80 side becomes narrow, and the side surface thereof is set to be an inclined surface. In addition, herein, the piezoelectric element 300 and a vibrating plate which generates displacement by driving of the piezoelectric element 300 are collectively referred to as a piezoelectric element, and are also referred to as an actuator device, in some cases. In the example described above, the elastic film 50, the zirconium oxide layer 55, and the first electrode film 60 are operated as a vibrating plate, however, it is not limited thereto, and the zirconium oxide layer 55, and the first electrode film 60 may be operated as a vibrating plate, without providing the elastic film 50.

The first electrode film 60 is provided on the zirconium oxide layer 55. As the first electrode film 60 of the embodiment, a laminated electrode structure of various metal such as iridium (Ir), platinum (Pt), titanium (Ti), or tungsten (W), alloy thereof, conductive complex oxide such as $LaNiO_3$ or $SrRuO_3$, and various metal films is used.

In addition, as a material (piezoelectric material) of the piezoelectric layer 70 configuring the piezoelectric element 300 in the embodiment, for example, a ferroelectric piezoelectric material such as lead zirconate titanate (PZT) or a relaxor ferroelectric to which metal such as niobium, nickel, magnesium, bismuth or yttrium is added, is used.

In addition, the piezoelectric layer 70 may be formed of a lead-free piezoelectric material, and as the lead-free piezoelectric material, bismuth ferrate (($BiFeO_3$), abbreviated as "BFO"), barium titanate (($BaTiO_3$), abbreviated as "BT"), potassium sodium niobate ((K, Na)($NbO_3$) abbreviated as "KNN"), sodium potassium lithium niobate ((K, Na, Li)($NbO_3$)), sodium potassium lithium tantalate niobate ((K, Na, Li)(Nb, Ta)$O_3$), potassium bismuth titanate (($Bi_{1/2}K_{1/2}$)$TiO_3$, abbreviated as "BKT"), sodium bismuth titanate (($Bi_{1/2}$ $Na_{1/2}$) $TiO_3$, abbreviated as "BNT"), bismuth manganate ($BiMnO_3$, abbreviated as "BM"), composite oxide having a perovskite structure containing bismuth, potassium, titanium, and iron (x [($Bi_xK_{1-x}$) $TiO_3$]-(1-x) [$BiFeO_3$], abbreviated as "BKT-BF"), or a composite oxide having a perovskite structure containing bismuth, iron, barium and titanium, ((1-x) [$BiFeO_3$]-x [$BaTiO_3$], abbreviated as "BFO-BT"), or a composite oxide to which metals such as manganese, cobalt, or chromium is added ((1-x) [Bi ($Fe_{1-y}M_y$) $O_3$]-x [$BaTiO_3$] (M is Mn, Co is Cr)) is used.

In addition, as the second electrode film 80, any of various metals such as Ir, Pt, tungsten (W), tantalum (Ta), or molybdenum (Mo) may be used, and an alloy thereof or metal oxide such as iridium oxide is used.

A lead electrodes 90 formed of gold (Au) or the like, for example, which is extracted from the vicinity of the end portion of the ink supply path 14 side and which extend to an upper portion of the zirconium oxide layer 55 is connected to each second electrode film 80 which is a separated electrode of the piezoelectric element 300. The voltage is selectively applied to each piezoelectric element 300 through the lead electrodes 90.

A protection substrate 30 including a piezoelectric element holding unit 32 which includes a space in an extent of not disturbing the motion of the piezoelectric element 300 on a region opposed to the piezoelectric element 300, is adhered onto the upper portion of the flow path forming substrate 10 on which the piezoelectric element 300 is formed, through an adhesive 35. In addition, the piezoelectric element holding unit 32 may be obtained as long as a space in an extent of not disturbing the motion of the piezoelectric element 300 is included, and the space may be hermetically sealed or may not be hermetically sealed.

In addition, in the protection substrate 30, the manifold unit 31 is formed on a region opposing to the communication unit 13, and, as described above, the manifold unit 31 configures the manifold 100 which is a common ink chamber for each pressure generating chamber 12 by communicating with the communicating unit 13 of the flow path forming substrate 10. Further, a penetration hole 33 which penetrates the protection substrate 30 in the thickness direction is provided in a region of the protection substrate 30 between the piezoelectric element holding unit 32 and the manifold unit 31, and a part of the first electrode film 60 and tip portions of the lead electrode 90 are exposed in the penetration hole 33.

In addition, a driving circuit (not shown) which drives the piezoelectric element 300 is fixed onto the protection substrate 30, and the driving circuit and the lead electrodes 90 are electrically connected to each other through a connection wire formed of a conductive wire such as a bonding wire, or the like.

As the protection substrate 30, a material having substantially the same coefficient of thermal expansion as the flow path forming substrate 10, for example, glass, ceramics or the like is preferably used, and in the embodiment, the protection substrate is formed by using a silicon single-crystal substrate which is the same material as the flow path forming substrate 10.

A compliance substrate 40 formed of a sealing film 41 and a fixing plate 42 is adhered to the upper portion of the protection substrate 30. Herein, the sealing film 41 is formed of a material having low rigidity, and flexibility (for example, a polyphenylene sulfide (PPS) film having a thickness of 6 µm), and one surface of the manifold unit 31 is sealed by the sealing film 41. In addition, the fixing plate 42 is formed with a hard material such as metal (for example, stainless steel (SUS) having a thickness of 30 µm, or the like). Since a region of the fixing plate 42 opposing to the manifold 100 is an opening portion 43 where the plate is completely removed in the thickness direction, one surface of the manifold 100 is sealed by only the sealing film 41 having flexibility.

In an ink jet-type recording head of the embodiment, after introducing ink from an external ink supply unit (not shown) and filling the inner portion from the manifold 100 to the nozzle opening 21 with the ink, voltage is applied between each of the first electrode film 60 and the second electrode film 80 corresponding to pressure generating chambers 12 according to a recording signal from the driving circuit, pressure inside each pressure generating chamber 12 is increased by flexural deformation of the elastic film 50 formed of a silicon oxide film 51, the zirconium layer 55, the first electrode film 60, and the piezoelectric layer 70, and ink droplets are discharged from the nozzle opening 21. In the embodiment, since adhesion of the first electrode film 60 or the elastic film 50 and the zirconium oxide layer 55 is excellent, the first electrode film 60 or the elastic film 50 is not peeled off from the zirconium oxide layer 55 even with the flexural deformation by driving the actuator device, and thus excellent durability is obtained.

Herein, a method of manufacturing the ink jet-type recording head will be described with reference to FIGS. 4A to 8B. FIGS. 4A to 8B are cross-sectional views of the pressure generating chamber in a longitudinal direction. First, as shown in FIG. 4A, a wafer 110 for a flow path forming substrate which is a silicon wafer is subjected to thermal oxidation with a diffusion furnace at about 1100° C., and the silicon dioxide film 51 configuring the elastic film 50 is formed on the surface thereof.

Then, as shown in FIGS. 4B and 4C, the zirconium oxide layer 55 formed of granular crystal grains is formed on the silicon oxide film 51. That is, as shown in FIG. 4B, a precursor layer 56 is formed by applying a precursor solution of zirconium oxide on the silicon oxide film 51, and the zirconium oxide layer 55 is formed by crystallizing the precursor layer 56 (FIG. 4C).

The precursor solution of the zirconium oxide used for the liquid phase method contains metal alkoxide containing Zr and metal carboxylate containing Zr.

Herein, as the metal alkoxide, tetramethoxy zirconium, tetraethoxy zirconium, tetrapropoxy zirconium, tetraisopropoxy zirconium, tetrabutoxy zirconium, tetrahexyl zirconium, tetrakis(2,4-pentanedionato) zirconium, or the like is used, however, it is not particularly limited as long as it is alkoxide containing Zr.

In addition, as the metal carboxylate, zirconium acetate, zirconium propionate, zirconium tributoxy propionate, zirconium tetrakis (butanoic acid), 2-ethylhexanoic acid zirconium, zirconium stearate, or the like is used, however, it is not particularly limited as long as it is carboxylate containing Zr.

The precursor solution is a solution obtained by dissolving the metal alkoxide or the metal carboxylate in a solvent containing carboxylic acid. As the carboxylic acid, it is not particularly limited, and for example, acetic acid, propionic acid, butanoic acid, or the like is used, however, acetic acid is preferable to be used.

In addition, so the precursor solution can improve a coating property and easily form a relatively thick film, it is preferable to contain a thickener. As the thickener, it is possible to use an organic high-molecular compound, for example, and polyethylene glycol, polyvinyl acetate, hydroxypropyl cellulose, polyethylene glycol monomethyl ether, polypropylene glycol, polyvinyl alcohol, polyacrylic acid, polyamides, polyamic acid, acetyl cellulose, or the like is used, however, it is preferable to use polyethylene glycol.

The precursor solution described above is a precursor solution in a case where the zirconium oxide layer 55 is a $ZrO_2$ layer, however, the zirconium oxide layer 55 may be an yttria stabilized zirconia (YSZ) layer, and the yttria stabilized zirconia (YSZ) is contained therein. The precursor solution in a case of forming the yttria stabilized zirconia (YSZ) layer by a liquid phase method, is a precursor solution obtained by adding a solution containing yttrium ion in metal alkoxide or metal carboxylate containing Zr. Herein, as the solution containing yttrium ion, it is not particularly limited, however, for example, an yttrium acetic acid solution, an yttrium propionic acid solution, an yttrium chloride solution, yttrium nitric acid solution, or the like is used.

Hereinafter, a forming step of the zirconium oxide layer 55 will be described.

First, metal alkoxide or metal carboxylate and the thickener are added to carboxylic acid, and then, water ($H_2O$) is added, heating stirring at about 70° C. for about 2 hours is performed, and a uniform and clear precursor solution is obtained. The precursor solution is applied on the substrate by a spin coating method at a rotation speed of 1400 rpm (applying step). Next, the solution applied to the substrate is heated to 160° C. to 200° C., and dried for about 5 minutes, and a dried film is obtained (drying step). Degreasing is performed by heating the dried film to 375° C. to 415° C., and holding for about 5 minutes (degreasing step). In addition, the degreasing herein is separating organic components included in the dried film as $NO_2$, $CO_2$. $H_2O$, for example. Next, the dried film is heated to 750° C. to 850° C., held for about 3 minutes, and crystallized (preliminary baking step), and then, the film is heated to 800° C. to 950° C. and held for about 1 hour, and thus, the zirconium oxide layer 55 is formed (proper baking step). In addition, as a heating device used for the drying step, the degreasing step, the preliminary baking step, and the proper baking step, an RTA (Rapid Thermal Annealing) device which heats by emitting an infrared lamp or a hot plate is used, for example.

Herein, in order to prevent peeling-off of the first electrode film 60 or the elastic film 50 from the zirconium oxide layer 55, it is necessary to improve adhesion of the first electrode film 60 or the elastic film and the zirconium oxide layer 55. For determining the adhesion thereof, the scratch strength (mN) of the zirconium oxide layer is measured using a thin film scratch tester. If the scratch strength (mN) is equal to or more than 300 mN and cracks are not generated, it is determined that the adhesion is high. It is because that in the liquid ejecting head, high resolution of arrangement of discharge ports which discharges each liquid droplet is realized every year to 300 dpi and to 600 dpi, and the strength larger than the scratch strength (150 mN) which is considered to be sufficient in the related art, is necessary. Since the zirconium oxide layer 55 formed by the liquid phase method using the precursor solution has high scratch strength (mN) of equal to or more than 300 mN and cracks are not generated, durability thereof is excellent.

In addition, it is desirable that the thickness of the zirconium oxide layer 55 to be formed by applying the precursor solution be thick. It is because that it is possible to reduce the number of steps and realize improvement of productivity. In the embodiment, if tetrakis(2,4-pentanedionato) zirconium (IV) is used as the metal alkoxide, it was found that the thickness of the zirconium oxide layer 55 can be thicker.

As described above, the formation by the liquid phase method is advantageous since environmental loads are small, it is suitable for mass production, and reduction of manufacturing cost is realized. Further, as the thickness which can be formed for one applying is large, the effect thereof is large.

After forming the zirconium oxide layer 55, for example, by laminating titanium (Ti), platinum (Pt), and iridium (Ir) on the zirconium oxide layer 55 by the sputtering method, as shown in FIG. 5A, the first electrode film 60 is formed.

Next, the piezoelectric layer 70 formed of lead zirconate titanate (PZT) is formed on the first electrode film 60. Herein, in the embodiment, the piezoelectric layer 70 which is obtained by dissolving and dispersing the metal organic substance in a solvent, that is, formed of metal oxide by applying and drying sol and gelating, and then, baking at a high temperature. That is to say, the piezoelectric layer 70 is formed using a sol-gel method. In addition, without being limited to the sol-gel method, for example, a MOD (Metal-Organic Decomposition) method or the like may be used. Further, other sputtering method may be used.

As a detailed forming procedure of the piezoelectric layer 70, first, as shown in FIG. 5B, a piezoelectric precursor film 71 which is a PZT precursor film is formed on the first electrode film 60. That is, the piezoelectric precursor film 71 is formed by applying sol (solution) containing a metal organic compound (lead zirconate titanate) on the flow path forming substrate 10 on which the first electrode film 60 is formed by the spin coating method or the like (applying step). Then, the piezoelectric precursor film 71 is heated to a predetermined temperature and dried for a given time (drying step). Next, the dried piezoelectric precursor film 71 is subjected to degreasing by heating to a predetermined temperature and holding for a given time (degreasing step). In addition, the degreasing herein is separating organic components included in the piezoelectric precursor film 71 as $NO_2$, $CO_2$, $H_2O$, for example.

Then, as shown in FIG. 5C, the piezoelectric precursor film 71 is heated to a predetermined temperature and held for a given time to be crystallized, and thus, a piezoelectric film 72 is formed (baking step). In addition, as a heating device used for the drying step, the degreasing step, and the baking step, an RTA (Rapid Thermal Annealing) device which heats by emitting an infrared lamp or a hot plate is used, for example.

Next, as shown in FIG. 6A, a resist 400 is formed on the piezoelectric film 72 and patterned in a predetermined shape. Then, as shown in FIG. 6B, the first electrode film 60 and the first piezoelectric film 72 are patterned at the same time with the resist 400 as a mask, so that each side surface thereof is inclined.

Next, after peeling off the resist 400, by repeating the piezoelectric film forming step including the applying step, the drying step, the degreasing step, and the baking step described above, several times, and forming the piezoelectric layer 70 formed of a plurality of piezoelectric films 72, the piezoelectric layer 70 having a predetermined thickness which is formed of the plurality of piezoelectric films 72 as shown in FIG. 6C is formed. For example, sol is applied to have a significantly thin thickness of the film for each time, and overall thickness of the piezoelectric layer 70 formed of the plurality of piezoelectric films is about 1 μm to 3 μm. In the embodiment, the piezoelectric films 72 are formed to be laminated, however, only one layer may be provided with a thicker thickness of one piezoelectric film 72. The piezoelectric layer 70 obtained as described above is flat and smooth and a protruding region does not exist.

After forming the piezoelectric layer 70, as shown in FIG. 7A, second electrode film 80 formed of iridium (Ir) is formed over the entire surface on the piezoelectric layer 70 by the sputtering method or the like, and patterned on the region opposing to each pressure generating chamber 12, and the piezoelectric element 300 formed of the first electrode film 60, the piezoelectric layer 70, and the second electrode film 80 is formed. In addition, the patterning of the piezoelectric layer 70 and the second electrode film 80 can be collectively performed by dry etching through a resist (not shown) formed in a predetermined shape. In the dry etching described above, when the side surface of the resist is previously inclined, the piezoelectric layer 70 and the second electrode film 80 are patterned so that the width of the second electrode film 80 side becomes narrow, and the side surface thereof becomes an inclined surface.

Next, as shown in FIG. 7B, after forming the lead electrode 90 formed of gold (Au) or the like, for example, over the entire surface of the wafer 110 for a flow path forming substrate, patterning is performed for each piezoelectric element 300 through the mask pattern (not shown) formed of resist, for example.

Then, as shown in FIG. 7C, a wafer 130 for protection substrate which is a silicon wafer and which becomes the plurality of protection substrates 30 is adhered to the piezoelectric element 300 side of the wafer 110 for a flow path forming substrate through the adhesive 35. In addition, since the wafer 130 for protection substrate has a thickness of about several hundred μm, for example, rigidity of the wafer 110 for a flow path forming substrate significantly improves by adhering the wafer 130 for protection substrate.

Next, as shown in FIG. 8A, the wafer 110 for a flow path forming substrate is set to be thin to have a thickness of some extent. In addition, a mask film 52 is newly formed on the wafer 110 for a flow path forming substrate, for example, and patterned in a predetermined shape.

As shown in FIG. 8B, the pressure generating chamber 12, the communicating unit 13, the ink supply path 14, and the communicating path 15 corresponding to the piezoelectric element 300 are formed by performing anisotropic etching (wet etching) of the wafer 110 for a flow path forming substrate using an alkali solution such as KOH, through the mask film 52.

After that, unnecessary parts of the outer periphery portion of the wafer 110 for a flow path forming substrate and the wafer 130 for a protection substrate are removed by cutting by dicing or the like, for example. After removing the silicon oxide film 51 on the surface of the wafer 110 for a flow path forming substrate on the side opposite to the wafer 130 for a protection substrate, the nozzle plate 20 on which the nozzle openings 21 are provided is adhered to the wafer thereof and the compliance substrate 40 is adhered to the wafer 130 for a protection substrate, and then, the wafer 110 for a flow path forming substrate is divided to the flow path forming substrate 10 and the like with one chip size shown in FIG. 1, and thus, the ink jet-type recording head of the embodiment is obtained.

Hereinafter, the invention will be further described in detail based on Examples and Comparative Examples.

Example 1

According to the embodiment, the wafer 110 for a flow path forming substrate was subjected to thermal oxidation in a diffusion furnace at about 1100° C., a silicon oxide film 51 having a thickness of 1 μm was formed, and a zirconium oxide layer 55 was formed on the silicon oxide film 51 by the gas phase method. The formation of the zirconium oxide layer 55 was performed with the following procedure. First, 1.0 mole of zirconium acetate (manufactured by Sigma-Aldrich Co. LLC., purity: 85% to 90%) (molecular weight of 327.4) which is a raw material of the zirconium oxide and 317.06 g of polyethylene glycol (average molecular weight of 600) which is a thickener were added to 475.60 g of acetic acid (manufactured by Kanto Chemical Co., Inc. purity: >99.7%), and then, 317.06 g of water was added thereto, heating and stirring at 70° C. for about 2 hours was performed, and a uniform and clear precursor solution was obtained. After that, the precursor solution was applied on the substrate at a rotating speed of 1400 rpm by the spin coating method (applying step).

Next, the solution applied on the substrate was heated to 160° C., and dried for 5 minutes, and a dried film was obtained (drying step). Degreasing was performed by heating the dried film to 415° C. and holding for 5 minutes (degreasing step). Next, the dried film was heated to 800° C., held for 3 minutes and crystallized (preliminary baking step), and then, the film was heated to 850° C. and held for 60 minutes, and a zirconium oxide layer 55 was formed (proper baking step). In addition, as a heating device used for the drying step, the degreasing step, and the preliminary baking step, an RTA (Rapid Thermal Annealing) device which heats by emitting an infrared lamp was used, for example. In the proper baking step, an electric furnace was used.

In addition, when calculating mass concentration of a metal component contained in the precursor solution as zirconium oxide, it was 7.35% by mass.

Example 2

The process was executed with the same conditions as Example 1 except for increasing 1.1 moles of zirconium acetate used in Example 1. In addition, when calculating mass concentration of a metal component contained in the precursor solution as zirconium oxide, it was 7.82% by mass.

Example 3

The process was executed with the same conditions as Example 1 except for increasing 1.2 moles of zirconium acetate used in Example 1. In addition, when calculating mass concentration of a metal component contained in the precursor solution as zirconium oxide, it was 8.26% by mass.

Example 4

The process was executed with the same conditions as Example 1 except for setting the raw material of zirconium oxide used in Example 1 as tetrakis(2,4-pentanedionato) zirconium and setting the number of moles as 1.0 mole (487.66 g). In addition, when calculating mass concentration of a metal component contained in the precursor solution as zirconium oxide, it was 7.71% by mass.

Example 5

The process was executed with the same conditions as Example 1 except for setting the raw material of zirconium oxide used in Example 1 as tetrakis(2,4-pentanedionato) zirconium and setting the number of moles as 1.5 moles. In addition, when calculating mass concentration of a metal component contained in the precursor solution as zirconium oxide, it was 10.04% by mass.

Example 6

The process was executed with the same conditions as Example 1 except for setting the raw material of zirconium oxide used in Example 1 as tetrakis(2,4-pentanedionato) zirconium and setting the number of moles as 2.0 moles. In addition, when calculating mass concentration of a metal component contained in the precursor solution as zirconium oxide, it was 11.82% by mass.

Example 7

A solution obtained by adding yttrium acetic acid to zirconium acetate used in Example 1 was used as a precursor solution. The preparation of the precursor solution was performed with the following procedure. 521.26 g of zirconium acetate (manufactured by Sigma-Aldrich Co. LLC., purity: 85% to 90%) which is a raw material of the zirconium oxide and 317.06 g of polyethylene glycol (average molecular weight of 600) which is a thickener were added to 475.60 g of acetic acid (manufactured by Kanto Chemical Co., Inc. purity: >99.7%), and then, 317.06 g of water was added thereto, 24.1 g of yttrium acetic acid was added thereto, heating and stirring at 70° C. for about 2 hours was performed, and a uniform and clear precursor solution was obtained. In addition, when calculating mass concentration of a metal component contained in the precursor solution as yttrium stabilized zirconia, it was 7.30% by mass.

Example 8

The process was executed with the same conditions as Example 1 except for increasing 1.5 moles of zirconium acetate which is a raw material of the zirconium oxide used in Example 1. In addition, when calculating mass concentration of a metal component contained in the precursor solution as zirconium oxide, it was 9.43% by mass.

Example 9

The process was executed with the same conditions as Example 1 except for increasing 2.0 moles of zirconium acetate which is a raw material of the zirconium oxide used in Example 1. In addition, when calculating mass concentration of a metal component contained in the precursor solution as zirconium oxide, it was 10.99% by mass.

Test Example

Thickness and scratch strength of zirconium oxide layers 55 of Examples 1 to 9 were measured.
The thickness was calculated using a scanning electron microscope (SEM).

For the scratch strength, a diamond indenter was adhered to a specimen fixed on a table, a load was gradually applied, and at the same time, the table was moved at a given speed, and thus, adhesion of the film was evaluated.

By setting the raw material of the zirconium oxide as zirconium acetate, measurement results of thicknesses and scratch strength (mN) of zirconium oxide layers 55 in a case of forming with the number of moles of 1.0 mole (Example 1), 1.1 moles (Example 2), 1.2 moles (Example 3), 1.5 moles (Example 8), and 2.0 moles (Example 9) are shown in Table 1. In addition, cracks on each zirconium oxide layer after the proper baking were observed, and scratch strength was measured only for the zirconium oxide layers on which the cracks were not generated. If the cracks were not generated and the scratch strength was equal to or more than 300 mN, it was assumed that the adhesion is high, and was determined as ○.

As a result, when setting the number of moles of the zirconium acetate as 1.0 mole, 1.1 moles, and 1.2 moles, cracks were not generated and the scratch strength was equal to or more than 300 mN, however, when increasing the number of moles of the zirconium acetate as 1.5 moles and 2.0 moles, the cracks were generated. However, even in a case of increasing the number of moles of the zirconium acetate as 1.5 moles and 2.0 moles, if drying and baking conditions or the like is changed, it is assumed that generation of cracks can be prevented and a film having high scratch strength can be formed.

However, in the film forming conditions described above, when forming the zirconium oxide layer 55 by setting the number of moles of the zirconium acetate as 1.0 mole, 1.1 moles, and 1.2 moles, it was found that a zirconium oxide layer 55 having excellent adhesion can be formed. A piezoelectric element including such zirconium oxide layer in a vibrating plate, a liquid ejecting head including this piezoelectric element, and a liquid ejecting apparatus including this liquid ejecting head can prevent peeling-off of the elastic film 50 from the zirconium oxide layer 55 and have excellent durability.

Measurement results of thicknesses and scratch strength (mN) of zirconium oxide layers 55 in a case of forming with tetrakis(2,4-pentanedionato) zirconium as the raw material of the zirconium oxide (Examples 4, 5, and 6) are shown in Table 2.

As a result, it was found that, the thickness of the zirconium oxide layer 55 can be thicker in the case of setting tetrakis(2,4-pentanedionato) zirconium as the raw material, than the case of using the zirconium acetate. Particularly, in a case of setting the raw material to have 1.0 mole, it was found that the thickness of the zirconium oxide layer 55 can be thick by 42%.

Herein, when setting the number of moles of the tetrakis(2,4-pentanedionato) zirconium as 1.0 mole and 1.5 moles, cracks were not generated and the scratch strength was equal to or more than 300 mN, however, when increasing the number of moles of the tetrakis(2,4-pentanedionato) zirconium as 2.0 moles, the cracks were generated.

Accordingly, in the film forming conditions described above, if the zirconium oxide layer 55 is formed by setting the number of moles of the tetrakis(2,4-pentanedionato) zirconium as 1.0 mole and 1.5 moles, it was found that, not only the thickness can be thick, but also the zirconium oxide layer 55 having excellent adhesion can be formed. A piezoelectric element including such zirconium oxide layer 55 in a vibrating plate, a liquid ejecting head including this piezoelectric element, and a liquid ejecting apparatus including this liquid ejecting head can prevent peeling-off of the elastic film 50 from the zirconium oxide layer 55 and have excellent durability.

Measurement results of thicknesses and scratch strength (mN) of zirconium oxide layers 55 in a case of forming the zirconium oxide layers 55 using yttrium stabilized zirconia (Example 7) are shown in Table 4.

As a result, it was found that, the scratch strength was further increased in the zirconium oxide layer 55 formed of yttrium stabilized zirconia formed by adding the yttrium acetic acid, compared to the zirconium oxide layer 55 formed by not adding yttrium acetic acid.

Accordingly, if the zirconium oxide layer 55 is formed using yttrium stabilized zirconia, it is possible to have a further excellent adhesion. A piezoelectric element including such zirconium oxide layer 55 in a vibrating plate, a liquid ejecting head including this piezoelectric element, and a liquid ejecting apparatus including this liquid ejecting head can prevent peeling-off of the elastic film 50 from the zirconium oxide layer 55 and have further excellent durability.

In such configuration, an actuator device having excellent adhesion of the first electrode film or the substrate and the zirconium oxide layer is obtained. In addition, the substrate may be used as long as it is a substrate in which one surface side on which the zirconium oxide layer is formed is formed of metal oxide, and for example, a substrate in which a metal oxide film is formed on a side of a substrate main body on which a zirconium oxide layer is provided, may be used.

In addition, in Embodiment 1 described above, the ink jet-type recording head has been described as an example of the liquid ejecting head, however, the invention is for general liquid ejecting heads, and can be also applied to a liquid ejecting head which ejects liquid other than ink. As the other liquid ejecting head, various recording heads used for an image recording apparatus such as a printer, a colorant ejecting head used for manufacture of color filters such as a liquid crystal display and the like, an electrode material ejecting

TABLE 2

|  | Raw material of zirconium oxide | Number of moles of raw material | Concentration (wt %) | Thickness (nm) | Cracks | Scratch strength (mN) | Determination |
|---|---|---|---|---|---|---|---|
| Example 1 | Zirconium acetate | 1.0 | 7.35 | 97 | Not generated | 1103 | ◯ |
| Example 2 |  | 1.1 | 7.82 | 100 | Not generated | 1027 | ◯ |
| Example 3 |  | 1.2 | 8.26 | 101 | Not generated | 983 | ◯ |
| Example 8 |  | 1.5 | 9.43 | 107 | Generated | — | X |
| Example 9 |  | 2.0 | 10.99 | 121 | Generated | — | X |

TABLE 3

|  | Raw material of zirconium oxide | Number of moles of raw material | Concentration (wt %) | Thickness (nm) | Cracks | Scratch strength (mN) | Determination | Thickness ratio (with respect to zirconium acetate) |
|---|---|---|---|---|---|---|---|---|
| Example 4 | tetrakis(2,4-pentanedionato) | 1.0 | 7.71 | 138 | Not generated | 712 | ◯ | 142% |
| Example 5 | zirconium (IV) | 1.5 | 10.04 | 147 | Not generated | 649 | ◯ | 137% |
| Example 6 |  | 2.0 | 11.82 | 152 | Generated | — | X | 126% |

TABLE 4

|  | Raw material of zirconium oxide | Number of moles of raw material | Concentration (wt %) | Thickness (nm) | Cracks | Scratch strength (mN) | Determination |
|---|---|---|---|---|---|---|---|
| Example 7 | Added yttrium acetic acid to Zirconium acetate | 0.98 | 7.30 | 103 | Not generated | 445 | ◯ |

OTHER EMBODIMENT

Hereinabove, the embodiment of the invention has been described, however the basic configuration of the invention is not limited to Embodiment 1 described above. For example, in Embodiment 1 described above, the silicon oxide layer and the zirconium oxide layer are sequentially formed on the substrate, however, the zirconium oxide layer may be directly formed on a substrate, using a substrate formed of metal oxide. As the metal of the metal oxide, Mg or the like is used.

head used for electrode formation such as an organic EL display, a FED (field emission display), or the like, or bioorganic material ejecting head used for bio chip manufacturing, and the like are used, for example. In addition, not only the actuator device mounted on the liquid ejecting head (ink jet-type recording head or the like), but the invention also can be applied to an actuator device mounted on various devices.

The entire disclosure of Japanese Patent Application No. 2012-072574, filed Mar. 27, 2012 and No. 2012-072572, filed Mar. 27, 2012 are expressly incorporated by reference herein.

What is claimed is:

1. A liquid ejecting head comprising a piezoelectric element which includes a piezoelectric layer and electrodes provided on the piezoelectric layer on a upper portion of a zirconium oxide layer,
   wherein the zirconium oxide layer is formed of granular crystal grains, and
   wherein a scratch strength of the zirconium oxide layer formed of granular crystal grains is greater than 1000 mN.

2. A liquid ejecting apparatus comprising the liquid ejecting head according to claim 1.

3. A piezoelectric element which is provided on an upper portion of a zirconium oxide layer and includes a piezoelectric layer and electrodes provided on the piezoelectric layer,
   wherein the zirconium oxide layer is formed of granular crystal grains, and
   wherein a scratch strength of the zirconium oxide layer formed of granular crystal grains is greater than 1000 mN.

4. The liquid ejecting head according to claim 1, wherein a crystal density, as observed with a scanning electron microscope, of the zirconium oxide layer being formed of granular crystal grains is greater than a crystal density, as observed with the scanning electron microscope, of a zirconium oxide layer being formed of columnar crystal grains.

5. The piezoelectric element according to claim 3, wherein a crystal density, as observed with a scanning electron microscope, of the zirconium oxide layer being formed of granular crystal grains is greater than a crystal density, as observed with the scanning electron microscope, of a zirconium oxide layer being formed of columnar crystal grains.

* * * * *